(12) United States Patent
Guha et al.

(10) Patent No.: US 8,026,439 B2
(45) Date of Patent: Sep. 27, 2011

(54) SOLAR CONCENTRATION SYSTEM

(75) Inventors: Supratik Guha, Yorktown Heights, NY (US); Philip C. Hobbs, Briarcliff Manor, NY (US); Yves C. Martin, Yorktown Heights, NY (US); Robert L. Sandstrom, Yorktown Heights, NY (US); Theodore G. van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/622,504

(22) Filed: Nov. 20, 2009

(65) Prior Publication Data
US 2010/0218817 A1    Sep. 2, 2010

(51) Int. Cl.
*H01L 31/00* (2006.01)
(52) U.S. Cl. .................................. 136/256; 136/259
(58) Field of Classification Search .................. None
See application file for complete search history.

(56) References Cited

U.S. PATENT DOCUMENTS

| | | |
|---|---|---|
| 3,984,685 A | 10/1976 | Fletcher et al. |
| 4,045,246 A | 8/1977 | Mlavsky et al. |
| 4,081,289 A | 3/1978 | Campbell, III |
| 4,086,485 A | 4/1978 | Kaplow et al. |
| 4,107,521 A | 8/1978 | Winders |
| 4,146,785 A | 3/1979 | Neale |
| 4,200,472 A | 4/1980 | Chappell et al. |
| 4,223,214 A | 9/1980 | Dorian et al. |
| 4,225,781 A | 9/1980 | Hammons |
| 4,262,195 A | 4/1981 | White et al. |
| 4,278,829 A | 7/1981 | Powell |
| 4,586,488 A | 5/1986 | Noto |
| 4,687,923 A | 8/1987 | Bauck |
| 4,691,075 A * | 9/1987 | Murphy ....................... 136/246 |
| 4,730,602 A | 3/1988 | Posnansky et al. |
| 4,868,379 A | 9/1989 | West |
| 5,153,778 A * | 10/1992 | Sasian-Alvarado .......... 359/742 |
| 5,498,297 A * | 3/1996 | O'Neill et al. .................. 136/246 |

(Continued)

FOREIGN PATENT DOCUMENTS

DE    2749992 A1    5/1979
(Continued)

OTHER PUBLICATIONS

Chia-Yen Lee et al., "Sun Tracking Systems: A Review," Sensors 2009, 9, 3875-3890.

(Continued)

*Primary Examiner* — Alexa Neckel
*Assistant Examiner* — Shannon Gardner
(74) *Attorney, Agent, or Firm* — Cantor Colburn LLP; Vazken Alexanian

(57) ABSTRACT

A solar concentration system includes an optically clear shell member having an outer surface and an inner surface, with the inner surface defining a hollow interior portion, a liquid contained within the hollow interior portion of the optically clear shell, and a solar collection system contained within the hollow interior portion of the optically clear shell. The solar collection system includes a tracking system configured and disposed to selectively shift within the hollow interior portion, a reflector member mounted to the tracking system, and a solar receiver mounted to the tracking system. The tracking system being configured and disposed orient the reflector member and the solar receiver to follow a path of the sun enhancing the collection of solar energy.

14 Claims, 2 Drawing Sheets

U.S. PATENT DOCUMENTS

| | | | |
|---|---|---|---|
| 5,593,544 A | 1/1997 | Fahlgren et al. | |
| 5,593,549 A | 1/1997 | Stirbl et al. | |
| 6,018,122 A | 1/2000 | Hibino et al. | |
| 6,034,319 A | 3/2000 | Falbel | |
| 6,127,620 A | 10/2000 | Tange et al. | |
| 6,337,129 B1 * | 1/2002 | Watanabe et al. | 428/328 |
| 6,399,874 B1 | 6/2002 | Olah | |
| 6,465,725 B1 | 10/2002 | Shibata et al. | |
| 6,583,349 B2 | 6/2003 | Tanaka | |
| 6,689,949 B2 | 2/2004 | Ortabasi | |
| 6,696,637 B2 | 2/2004 | Lawheed | |
| 6,992,276 B2 | 1/2006 | Blauvelt et al. | |
| 7,148,465 B2 | 12/2006 | Blauvelt et al. | |
| 7,177,140 B2 | 2/2007 | Clarke et al. | |
| 7,208,674 B2 | 4/2007 | Aylaian | |
| 2001/0006066 A1 | 7/2001 | Cherney et al. | |
| 2004/0011395 A1 | 1/2004 | Nicoletti et al. | |
| 2006/0041345 A1 | 2/2006 | Metcalf | |
| 2006/0225778 A1 * | 10/2006 | Brabec et al. | 136/244 |
| 2007/0144574 A1 | 6/2007 | Yada | |
| 2007/0215199 A1 | 9/2007 | Dold et al. | |
| 2008/0017784 A1 | 1/2008 | Hoot et al. | |
| 2008/0138634 A1 * | 6/2008 | Morris et al. | 428/447 |
| 2008/0172256 A1 | 7/2008 | Yekutiely | |
| 2008/0308152 A1 | 12/2008 | Grip | |
| 2008/0314438 A1 | 12/2008 | Tran et al. | |
| 2009/0043253 A1 | 2/2009 | Podaima | |
| 2009/0084435 A1 | 4/2009 | Guha et al. | |
| 2009/0188488 A1 | 7/2009 | Kraft et al. | |
| 2009/0199846 A1 | 8/2009 | Collins et al. | |
| 2009/0229794 A1 | 9/2009 | Schon | |
| 2009/0308377 A1 * | 12/2009 | Kleinwaechter | 126/605 |
| 2010/0000518 A1 | 1/2010 | Chen et al. | |
| 2010/0031991 A1 * | 2/2010 | Mochizuki et al. | 136/206 |
| 2010/0101560 A1 | 4/2010 | Olsson et al. | |

FOREIGN PATENT DOCUMENTS

| | | |
|---|---|---|
| JP | 3-256580 A | 11/1991 |
| JP | 5052702 A | 3/1993 |
| WO | WO 2008034423 A2 * | 3/2008 |

OTHER PUBLICATIONS

International Search Report; International Application No. PCT/US2011/020654; International Filing Date: Jan. 10, 2011; Date of Mailing: Mar. 9, 2011.

International Search Report—Written Opinion; International Application No. PCT/US2011/020654; International Filing Date: Jan. 10, 2011; Date of Mailing: Mar. 9, 2011.

* cited by examiner

SOLAR CONCENTRATION SYSTEM

BACKGROUND

The present invention relates to solar concentrators and, more particularly, to a solar concentrator including an optical tracking system.

Solar power systems fall generally into two categories: fixed position flat panels and tracking concentrator systems. Fixed position flat panel systems employ one or more stationary panels that are arranged in an area having an unobstructed view of the sun. As the earth rotates, the sun's rays move over the stationary panel(s) with varying degrees of intensity depending upon geographic location, the time of day and the time of the year. In contrast, solar concentrator systems collect, and focus the sun's rays onto one or more solar cells. Certain solar concentration systems employ tracking systems that follow the sun's path in order to enhance energy collection. Simply put, fixed position flat panels represent a passive solar collection system, while solar concentrator systems represent a more active energy collection system.

Solar concentrator systems utilizing photovoltaic cells typically operate at or below about 500 suns concentration. Operating at higher sun concentration levels creates cooling challenges. In order to address the cooling challenges, certain solar concentration systems employ liquid cooling systems such as found in U.S. Pat. No. 4,081,289. In the '289 patent, a sphere contains a liquid medium and a plurality of fixed solar panels. The sphere acts as a lens and the liquid as a focal and cooling medium. The liquid is circulated within the sphere to carry away heat generated by solar rays impacting the fixed solar cells. In addition to serving as a heat exchange medium, the liquid, in combination with the sphere, focuses the sun's rays toward the fixed solar cells. While effective as a cooling medium, the use of the sphere and liquid to focus light imparts significant limitations on energy collection. That is, the actual focal point of the light passing through the sphere and the liquid is outside of the sphere itself.

Solar concentrator systems allow the use of fewer semiconductor elements to produce a given amount of electric power. However, the use of fewer semiconductor elements results in a need for optics and a system for tracking the sun. At present, the additional cost associated with the necessary optics and tracking systems does not exceed the cost benefit of a reduced number of solar cells.

SUMMARY

According to one exemplary embodiment, a solar concentration system includes an optically clear shell member having an outer surface and an inner surface, with the inner surface defining a hollow interior portion, a liquid contained within the hollow interior portion of the optically clear shell, and a solar collection system contained within the hollow interior portion of the optically clear shell. The solar collection system includes a tracking system configured and disposed to selectively shift within the hollow interior portion, a reflector member mounted to the tracking system, and a solar receiver mounted to the tracking system. The tracking system being configured and disposed to orient the reflector member and the solar receiver to follow a path of the sun enhancing the collection of solar energy.

According to another exemplary embodiment, a method of concentrating solar energy includes receiving solar energy through a surface of an optically clear shell, guiding the solar energy through a liquid contained in the optically clear shell, folding the solar energy back through the liquid toward a solar receiver, and shifting the solar receiver within the optically clear shell to track the sun, wherein the solar energy collected by the solar receiver is converted into electrical energy.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
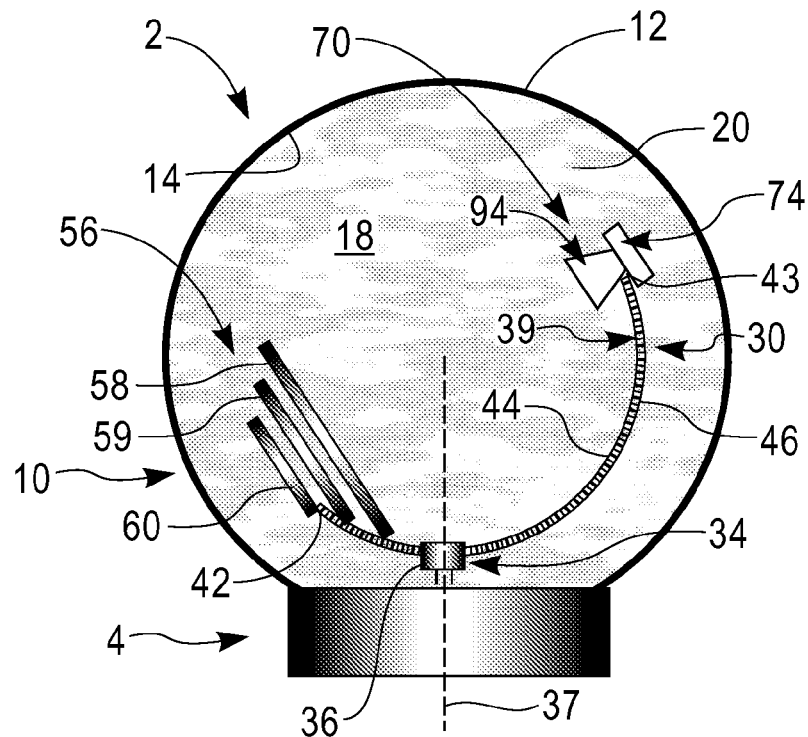
FIG. 1 is an elevational view of a solar concentrator including a solar collection system in accordance with an exemplary embodiment.
Figure 2:
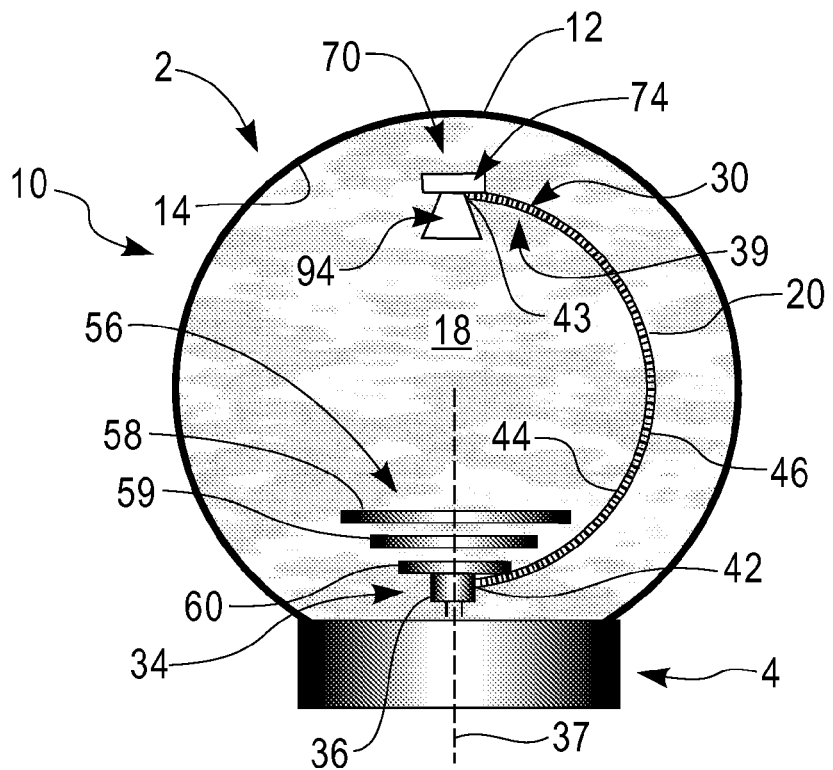
FIG. 2 is the solar concentrator showing the solar collection system shifting to track the sun.

With reference now to FIGS. 1 and 2, a solar concentration system constructed in accordance with an exemplary embodiment, is indicated generally at 2. Solar concentration system 2 includes a base member 4 that supports an optically clear shell 10. Optically clear shell 10 includes an outer surface 12 having an anti reflective and/or anti-fouling coating such as polydimethylsiloxane (PDMS). Optically clear shell 10 includes an inner surface 14 that defines a hollow interior portion 18. In accordance with an exemplary embodiment, hollow interior portion 14 is filled with a liquid 20 such as water. Of course other liquids such as glycol, alcohol, and the like can also be employed to prevent freezing or to adjust an optical index. Solar concentration system 2 is further shown to include a solar collection system 30 arranged within hollow interior portion 18.

In accordance with an exemplary embodiment, solar collection system 30 includes a tracking system 34 having a base element 36 that is configured and disposed to rotate about an axis 37. Tracking system 34 is further shown to include a support arm 39 that is operatively connected to base element 36 in a manner that will be detailed more fully below. Support arm 39 includes a first end 42 that extends to a second end 43 through an arcuate intermediate portion 44. Intermediate portion 44 is provided with a plurality of gear teeth 46 that are configured and disposed to cooperate with a corresponding gear element (not shown) provided within base element 36. In this manner, support arm 39 shifts between first end 42 and second end 43 relative to base element 36. That is, tracking system 34 includes at least one of an alt/azimuth and an elevation drive system that aims solar collection system 30 toward the sun's position in the sky at a given time and in a particular geographic area such as shown in FIG. 2. More specifically, tracking system 34 rotates about axis 37 and shifts support arm 39 between first and second ends 42 and 43 to position reflector member 56 relative to the sun.

In accordance with an exemplary embodiment, reflector member 56 is mounted to first end 42 of support arm 39. Reflector member 56 includes a plurality of reflector surfaces 58-60 that are arranged in a stepped configuration. In accordance with one exemplary embodiment, reflective surfaces 58-60 are flat to reduce cost. Reflective surfaces 58-60 fold the optical path such that the focus is within optically clear shell 10. The use of multiple reflective surfaces aids in correcting spherical aberration, however, it should be understood that reflector member 56 could also include a single reflector that is formed, for example, to have a flat circular construction. Of course, it should be understood that reflector 56 can take on a variety of forms. That is, reflector member 56 could include one or more planer mirrors, convex mirrors, and/or concave mirrors depending upon the level of solar concentration desired. In any event, solar rays passing through optically clear shell 10 impact reflector member 56. Reflector member 56 folds the rays back towards a solar receiver system 70 mounted at second end 43 of support arm 39.

Figure 3:
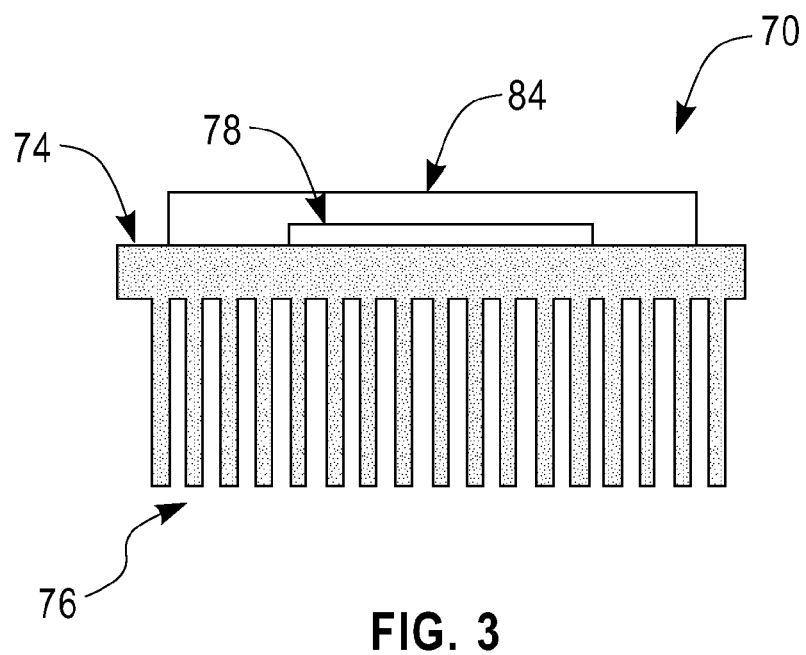
FIG. 3 is an elevational view of a solar receiver portion of the solar collection system in accordance with an exemplary embodiment.
Figure 4:
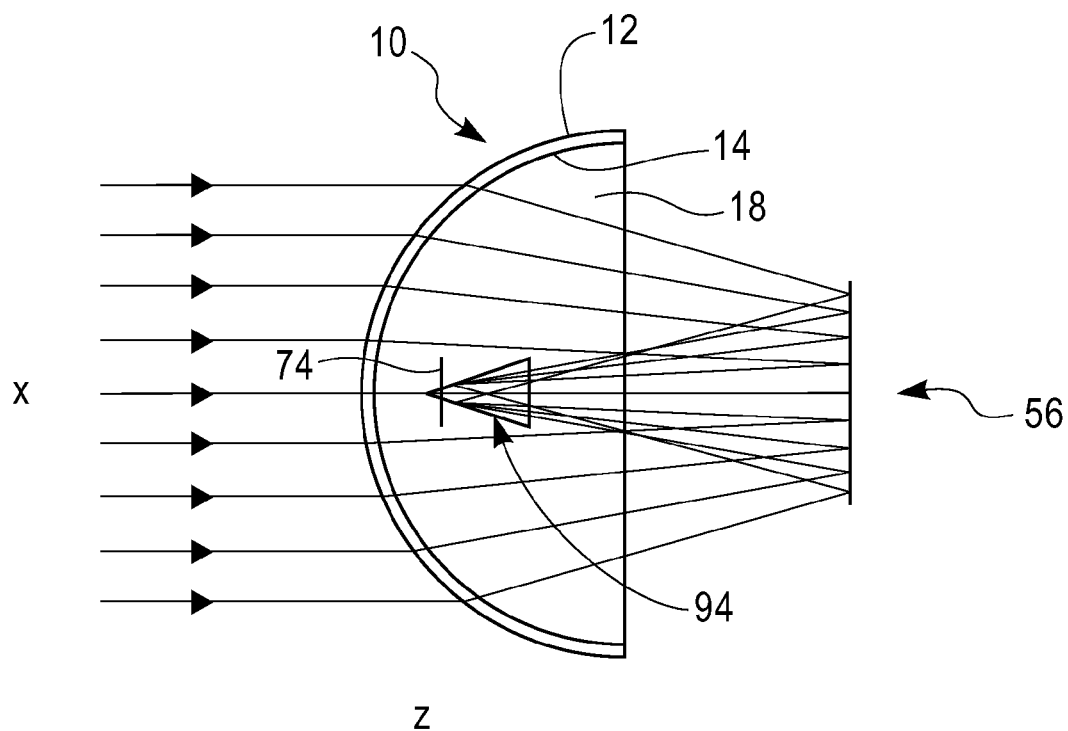
FIG. 4 is a schematic view of the solar concentrator showing the solar collection system focusing solar rays onto the solar receiver in accordance with an exemplary embodiment.

As best shown in FIG. 3, solar receiver system 70 includes a heat sink 74 having a plurality of fins 76. A solar receiver 78 is mounted to heat sink 74 and is encapsulated by a clear shell 84. Clear shell 84 provides a seal that protects solar receiver from liquid 20. In accordance with one aspect of an exemplary embodiment, clear shell 84 is formed from a plastic encapsulant such as or epoxy. In accordance with another aspect of an exemplary embodiment, clear shell 84 is formed having multiple layers formed from materials such as glass, acrylic, silicone and plastic. Solar receiver 78 takes the form of a photovoltaic cell that is configured and disposed to convert light energy to electrical energy. With this arrangement, the solar rays folded back from reflector member 56 impinge upon solar receiver 78. More specifically, the distortion produced by passing light through a sphere would locate the focal point of the solar energy at a point outside hollow interior portion 18. Reflector member 56 corrects for the distortion by folding the light back to a focal point within hollow interior portion 18, i.e., upon solar receiver 78 as shown in FIG. 4. Solar receiver 78 in turn produces an electrical output. In accordance with an exemplary embodiment, reflector member 56 concentrates the solar energy passing though shell 10 to a level of about 2000 suns (200 watts/cm$^2$) or more of incident light. This level of solar concentration produces a significant amount of heat that must be dissipated. Towards that end, the heat developed by the concentrated solar rays impinging upon solar receiver 78 is dissipated by heat sink 74. Heat sink 74 initiates a convective cooling effect through liquid 20 to lower temperatures at solar receiver 78.

As further shown in FIG. 1, solar receiver 70 includes a light cup 94, or reflective optic, that is positioned across solar receiver 78. Light cup 94 collects any stray solar rays that are folded back from reflector member 56 towards solar receiver 78 in order to achieve even higher energy conversion efficiencies. In place of light cup 94, a light pipe, or refractive optic, (not shown) having a substantially cylindrical cross-section is employed to gather stray light. The use of light cup 94 (reflective optic) or a light pipe (not shown) (refractive optic) improves collection efficiency in the presence of optical distortions and tracking errors (improved acceptance angle). In addition to improving collection efficiency, light cup 94 and/or the light pipe homogenize the gathered light with respect to solar receiver 74.

The low cost per watt is further enhanced by tracking system 34. That is, tracking system 34 represents a near zero mass within liquid 20 which decreasing costs associated with moving the various optical components. In addition, liquid 20 serves as a dampener. More specifically, liquid 20 acts to dampen the motion of tracking system 34 thereby limiting oscillations of the collection components, e.g., reflector member 56 and solar receiver 78. By minimizing oscillations of the collection components, the need for complicated correction algorithms is avoided. The stepped configuration of reflector member 56 further aids in damping. Finally, the use of a passive, convective, cooling system eliminates the need to complicated and costly fluid circulation systems.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A solar concentration system comprising:
    an optically clear shell member having an outer surface and an inner surface, the inner surface defining a hollow interior portion;
    a liquid substantially filling the hollow interior portion of the optically clear shell; and
    a solar collection system contained within the hollow interior portion of the optically clear shell, the solar collection system including:
        a tracking system arranged entirely within the hollow interior portion of the optically clear shell, the tracking system being configured and disposed to selectively shift within the hollow interior portion;
        a reflector member mounted to the tracking system; and
        a solar receiver mounted to the tracking system, the tracking system being configured and disposed to orient the reflector member and the solar receiver to follow a path of the sun enhancing the collection of solar energy.

2. The solar concentration system according to claim 1, wherein the solar receiver comprises a photovoltaic cell.

3. The solar concentration system according to claim 2, wherein the photovoltaic cell is encapsulated in a clear shell.

4. The solar concentration system according to claim 1, further comprising: a heat sink mounted to the tracking system, the solar receiver being mounted to a heat sink.

5. The solar concentration system according to claim 1, further comprising:
at least one of a light cup and a light pipe fixedly mounted relative to the solar receiver, the light cup being configured and disposed to collect solar energy from the reflector member and focus the solar energy onto the solar receiver.

6. The solar concentration system according to claim 1, wherein the tracking system includes at least one of an azimuth drive and an elevation drive.

7. The solar concentration system according to claim 1, wherein the optically clear shell member includes at least one of an anti-reflective coating and an anti-fouling coating.

8. The solar concentration member according to claim 7, wherein the at least one anti-reflective coating and anti-fouling coating comprises polydimethylsiloxane (PDMS).

9. The solar concentration system according to claim 1, wherein the reflector member is a mirror having at least one reflective surface.

10. The solar concentration system according to claim 9, wherein the at least one reflective surface is curvilinear.

11. The solar concentration system according to claim 10, wherein the at least one reflective surface includes a plurality of reflective surfaces.

12. The solar concentration system according to claim 10, wherein the at least one reflective surface includes a plurality of stepped reflective surfaces.

13. The solar concentration system according to claim 1, wherein the liquid comprises glycol.

14. The solar concentration system according to claim 1, wherein the liquid is water.

* * * * *